(12) United States Patent
Nikutta

(10) Patent No.: US 6,639,846 B2
(45) Date of Patent: Oct. 28, 2003

(54) METHOD AND CIRCUIT CONFIGURATION FOR A MEMORY FOR REDUCING PARASITIC COUPLING CAPACITANCES

(75) Inventor: Wolfgang Nikutta, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/114,795

(22) Filed: Apr. 2, 2002

(65) Prior Publication Data

US 2002/0167848 A1 Nov. 14, 2002

(30) Foreign Application Priority Data

Apr. 2, 2001 (DE) .......................... 101 16 325

(51) Int. Cl.[7] ................................ G11C 7/00
(52) U.S. Cl. ................ 365/189.07; 365/149; 365/203; 365/205
(58) Field of Search .................... 365/189.07, 149, 365/203, 205

(56) References Cited

U.S. PATENT DOCUMENTS 5,555,203 A * 9/1996 Shiratake et al. ............ 365/51
5,815,451 A * 9/1998 Tsuchida .................... 365/203
6,181,620 B1 * 1/2001 Agata et al. ................ 365/203

* cited by examiner

*Primary Examiner*—David Nelms
*Assistant Examiner*—Connie C. Yoha
(74) *Attorney, Agent, or Firm*—Laurence A. Greenberg; Werner H. Stemer; Ralph E. Locher

(57) ABSTRACT

A method and a circuit configuration for a dynamic semiconductor memory are described in which, in order to reduce the parasitic coupling effects between two adjacent bit lines, in particular between a read line and a reference line, the adjacent line is put at a predetermined potential during the read operation. As a result, the read signal, which is very small in the worst-case scenario, is not adversely influenced by the coupling capacitance, since the inactive adjacent line acts as capacitive shielding. Advantageously, the read signals of the various active bit lines cannot mutually influence one another. A further refinement of the invention provides for the potential to be kept at the magnitude of the precharge state.

14 Claims, 4 Drawing Sheets

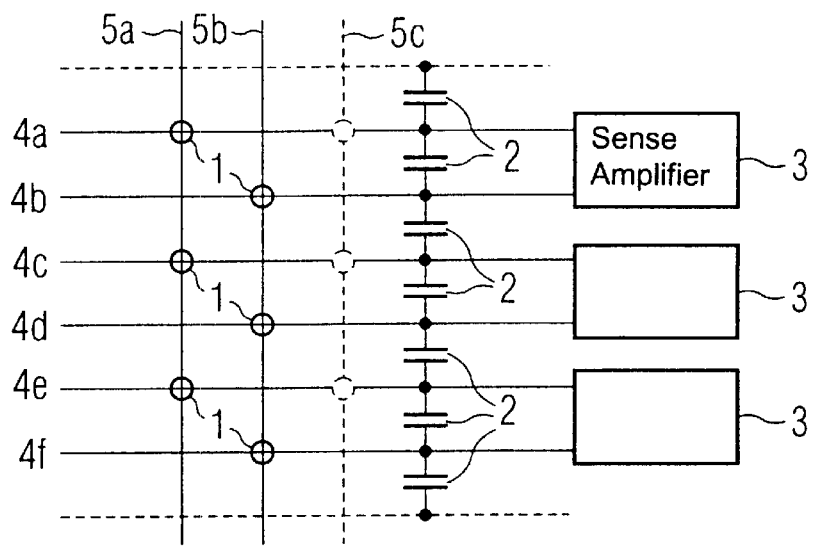
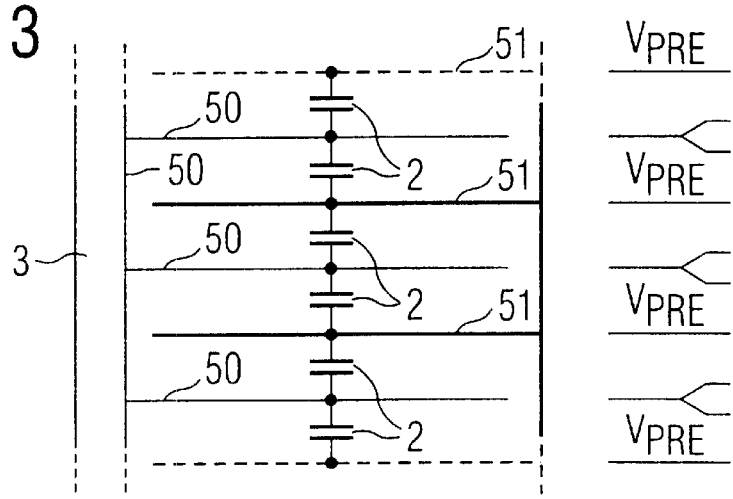

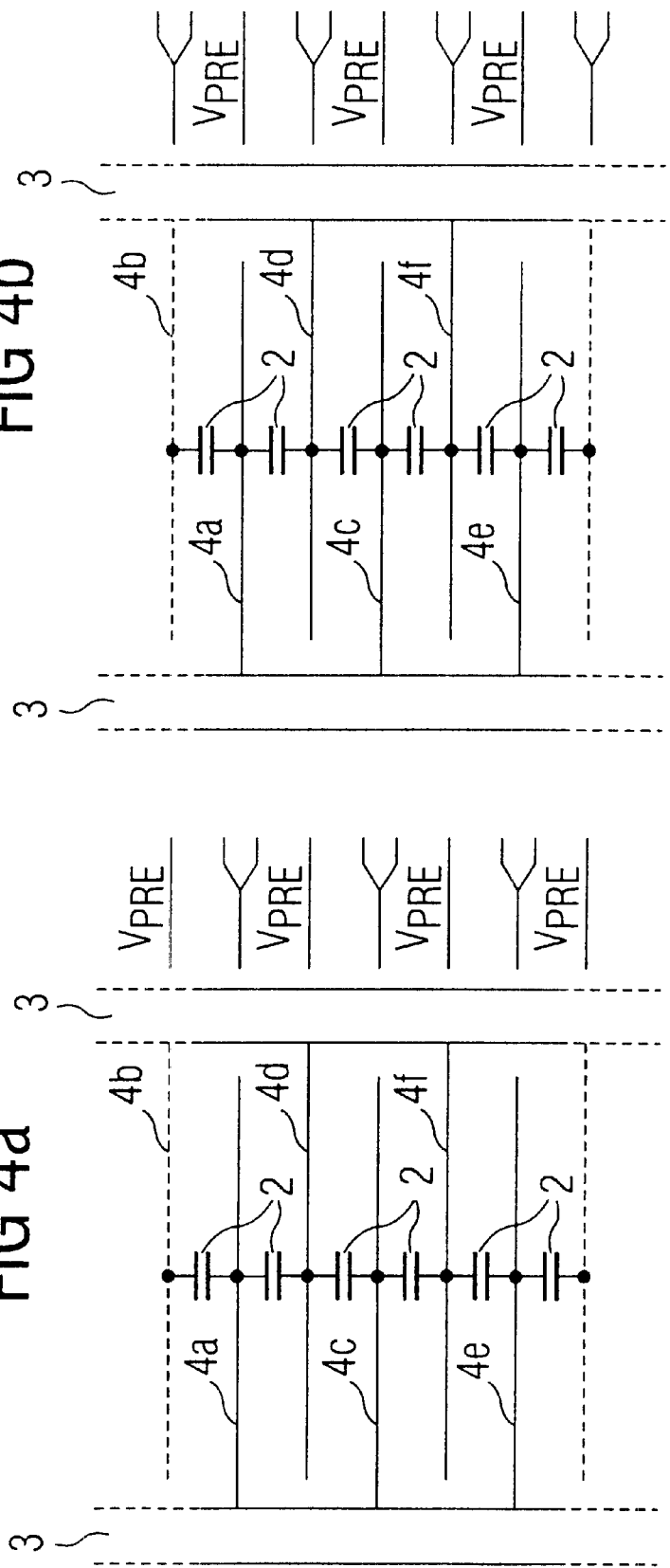

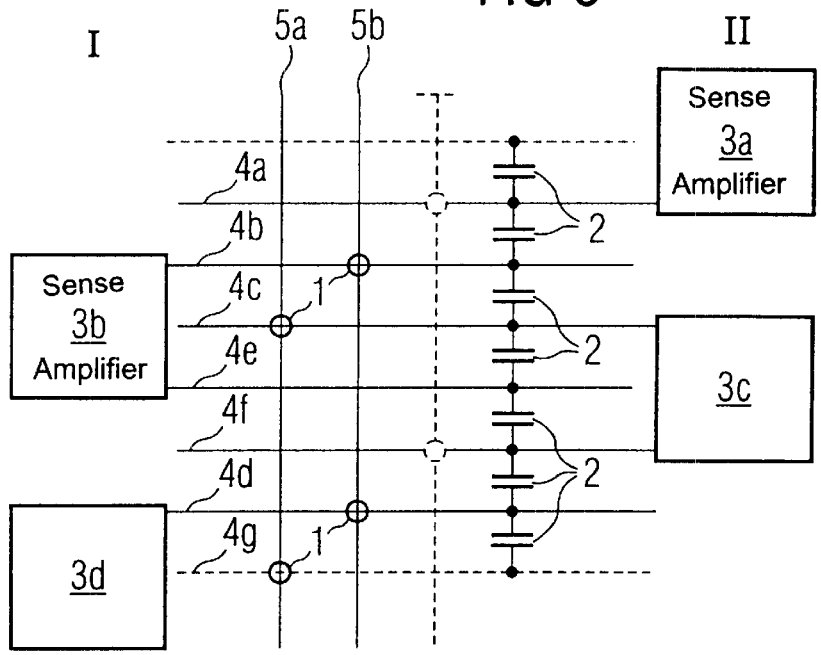
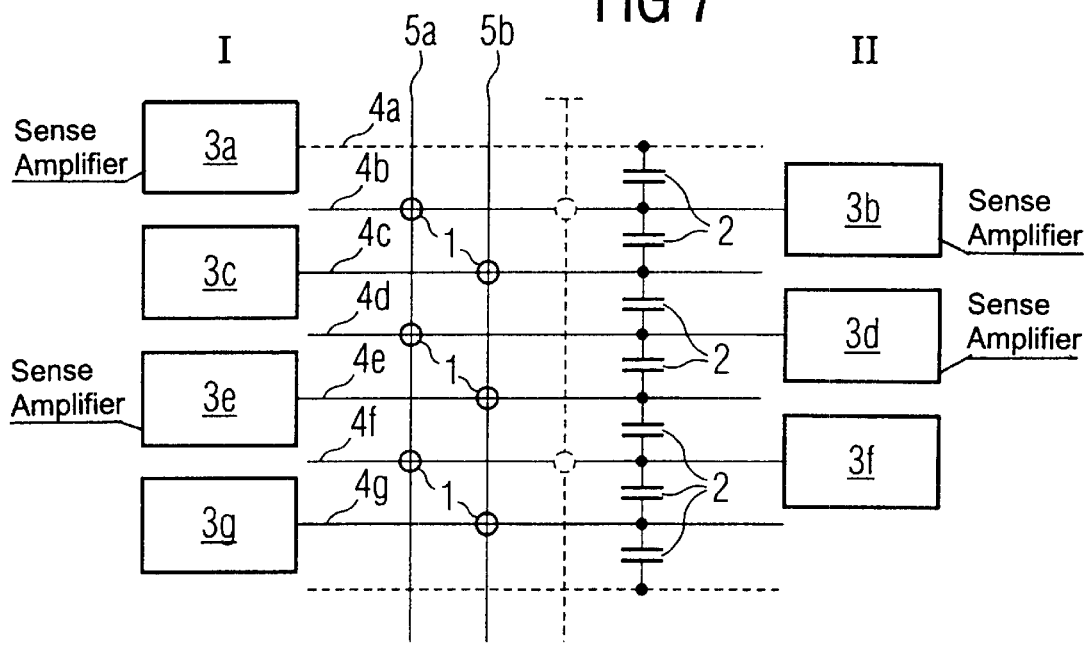

METHOD AND CIRCUIT CONFIGURATION FOR A MEMORY FOR REDUCING PARASITIC COUPLING CAPACITANCES

BACKGROUND OF THE INVENTION

Field of the Invention

The invention proposes a circuit configuration and a method for a memory, in particular for a DRAM, having a multiplicity of memory cells disposed in rows and columns.

It is known, in order to read and evaluate the cell information of a memory cell of a dynamic random access memory (DRAM) module upon the activation of a corresponding word line, to reverse the charge of one of the two bit lines (read line) of a read memory in accordance with the potential of the memory cell, while a second bit line is used as a reference line. The sense amplifier measures the voltage difference between the two bit lines, evaluates it and sets the read line either to 0 volts or to the potential of the supply voltage. In this case, the reference line is subjected to charge reversal to the inverse polarity.

What is disadvantageous about the method is that the read signal can be impaired by a parasitic coupling capacitance between the activated read line and the reference line, but also by coupling capacitances with respect to the adjacent lines, since the coupling voltage can increase or decrease the read signal. This can lead to incorrect evaluations particularly when operating the memory module for the worst-case data combinations on bit lines or the memory cells thereof, since the measured voltage difference—caused by the parasitic coupling capacitance—between two adjacent bit lines is dependent on the data topology and the line routing thereof on the semiconductor chip of the memory module.

It has previously been attempted to solve this problem by reducing the parasitic coupling capacitances through skillful line routing. By way of example, in the configuration of "twisted bit lines", the two assigned bit lines are disposed as far as possible multiply alternately crossed, thereby resulting in smaller coupling capacitances which largely compensate for one another owing to their alternating polarities. The configuration has the disadvantage, however, that the many crossovers on the memory module require more chip area, which is undesirable for cost reasons. Added to this is the fact that the crossovers likewise result in asymmetries in the layout that require an increased outlay on testing in the fabrication of the memory module. Moreover, the innumerable node contacts give rise to increased yield risk, since each node contact can represent an additional potential defect source. Overall, this solution is regarded as extremely unsatisfactory for technical and economic reasons.

SUMMARY OF THE INVENTION

It is accordingly an object of the invention to provide a method and a circuit configuration for a memory for reducing parasitic coupling capacitances which overcome the above-mentioned disadvantages of the prior art devices and methods of this general type, in which the interference from parasitic coupling capacitances is reduced in conjunction with a simplified memory organization.

With the foregoing and other objects in view there is provided, in accordance with the invention, a memory circuit configuration. The memory contains word lines disposed in a column form, bit lines disposed in a row form, sense amplifiers, and a multiplicity of memory cells connected to and activated by the word lines. The bit lines connect the memory cells to the sense amplifiers. If a respective word line of the word lines is activated, at least one of the bit lines being a first bit line and being associated with a respective memory cell of the memory cells electrically connects the respective memory cell to a respective sense amplifier of the sense amplifiers for reading-out a datum. The sense amplifiers during the reading-out on the first bit line put an adjacent one of the bit lines being a second bit line adjacent to the first bit line actively at a predetermined potential.

The circuit configuration according to the invention and the method according to the invention have the advantage that the many crossovers of the bit lines can be dispensed with, so that not only is chip area saved in the layout, but the test method for the memory module is also simplified owing to the maintained symmetry. In this case, it is regarded as particularly advantageous that the undesirable parasitic coupling capacitances are likewise reduced, so that, in particular also in the event of unfavorable line routing, the read signal can be measured virtually uncorrupted by the sense amplifier. As a result, the error rate for the measurement of the read signal is reduced and the yield can be increased in fabrication.

It is regarded as particularly advantageous that the sense amplifier puts or keeps the potential of the second bit line at the potential of the precharge state. As a result, the adjacent inactive bit lines (reference bit lines) advantageously act as shielding with respect to the activated bit line, without the need to implement further measures for compensation of the parasitic coupling capacitance.

One favorable solution is also seen in the fact that the sense amplifier puts the first bit line actively at the precharge potential, while it reads out the second bit line. As a result, the greatest possible freedom of configuration is obtained in the configuration of the bit lines. Furthermore, the test method can be carried out in a simplified fashion in a manner that saves time and costs.

A further alternatively advantageous configuration for reducing the parasitic coupling capacitances of the bit lines consists in connecting in each case the first and third bit line or the second and fourth bit line to a respective sense amplifier.

It is likewise advantageous for the architecture of the memory module for in each two adjacent bit lines to be connected to a respective sense amplifier. As a result, each desired bit line can be set actively or passively to a predetermined potential in a simple manner. In particular, in this way it is possible to use bit lines from adjacent activation arrays that are inactivated at the instant of the evaluation of the read signal.

An alternative solution that is regarded as particularly favorable also relates to using sense amplifiers that can carry out an evaluation of the read signal without a reference bit line. This makes it possible to save further bit lines on the memory chip, so that the available area can be utilized even better.

With the foregoing and other objects in view there is provided, in accordance with the invention, a method for reading a datum from a memory cell of a memory array via a first bit line. The memory array has a plurality of bit lines disposed next to one another. The method includes the steps of activating a word line connected to the memory cell for connecting the first bit line to the memory cell, putting at least one second bit line disposed next to the first bit line at a defined voltage, and reading-out and evaluating a voltage impressed on the first bit line.

In accordance with an added mode of the invention, there is the step of setting the defined voltage to be a precharge voltage to which the second bit line is charged prior to the reading-out of the datum.

In accordance with a further mode of the invention, there is the step of putting the word line at a further defined voltage during the reading-out.

Other features which are considered as characteristic for the invention are set forth in the appended claims.

Although the invention is illustrated and described herein as embodied in a method and a circuit configuration for a memory for reducing parasitic coupling capacitances, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block circuit diagram of a known circuit configuration with parasitic coupling capacitances;

FIG. 2 is a circuit diagram of a known memory cell;

FIG. 3 is a schematic diagram of a memory cell according to the invention;

FIGS. 4a and 4b are schematic diagrams showing two alternative exemplary embodiments of the invention;

FIG. 5 is a circuit block diagram of a third exemplary embodiment of the invention;

FIG. 7 is a circuit block diagram of a fifth exemplary embodiment of the invention.

DESCRIPTION OF THE PREFERRED EMBODIMENTS

Figure 6:
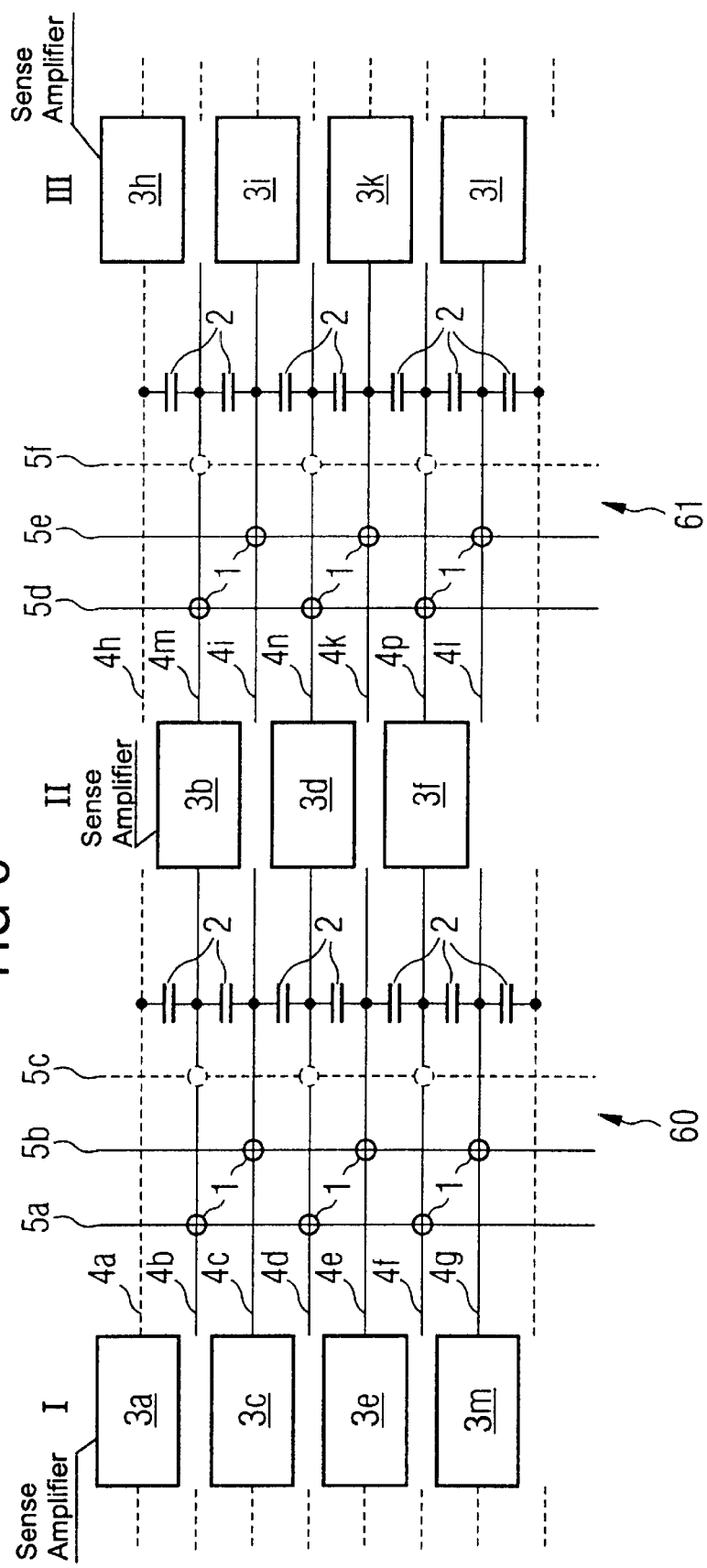
FIG. 6 is a circuit block diagram of a fourth exemplary embodiment of the invention.

Referring now to the figures of the drawing in detail and first, particularly, to FIG. 1 thereof, there is shown, in order to provide a better understanding of the invention, a known solution to the problem of preventing parasitic coupling effects. In particular, the problem of the parasitic coupling-in of a voltage, and its existing disadvantages are discussed. FIG. 1 shows a circuit configuration of a known DRAM memory module, in which memory cells 1 are disposed in matrix form at points of intersection of individual columns and rows. Bit lines 4a . . . f are illustrated in the x-direction, in each case two bit lines, for example the bit lines 4a and 4b, 4c and 4d, and 4e and 4f, being led to a respective sense amplifier 3. In this case, each of the memory cells 1 is connected to the sense amplifier 3 via only one bit line. The individual memory cells are controlled by vertically illustrated word lines 5a, 5b, 5c. In the event of activation of the word line 5a, by way of example, the three memory cells 1 of the three bit lines 4a, 4c and 4e are activated simultaneously, so that the potential thereof can be read by the three sense amplifiers 3 illustrated. The activated bit lines via which data are read out are referred to as read-out lines. The same applies correspondingly to the word line 5c, etc.

The memory cells 1 of the bit lines 4b, 4d and 4f are not activated by the word line 5b at this point in time. With their potential (0 volts or operating voltage) they serve as a reference line for the sense amplifiers 3. Since the bit lines are disposed such that they are spaced very closely on the layout of the memory chip, an undesirable parasitic coupling capacitance (coupling capacitor 2) results owing to the different potentials for example between the read-out line 4a and the reference line 4b. In addition, depending on the read signal polarity, the adjacent bit line 4c couples positively or negatively onto the reference bit line 4b, which can again reduce the signal difference between the bit lines 4a and 4b. In this way, parasitic voltages that corrupt the voltage on the corresponding bit line are also coupled in. The further coupling capacitors 2 apply analogously to the remaining read-out and reference lines illustrated.

FIG. 2 shows the schematic construction of the DRAM memory cell 1. It essentially has a storage capacitor 22, which is connected to a potential Vp by one of its terminals. Its second terminal is connected to an assigned bit line, for example the bit line 4a, via the main current path of a switching transistor 21. A control input of the switching transistor 21 is connected to the associated word line, in this case to the word line 5a. During the read operation of the sense amplifier 3, the word line 5a is activated and the switching transistor 21 is thereby turned on. As a result, the potential of the storage capacitor 22 is transferred onto the bit line 4a. At the end of the read operation, after the evaluation of the read signal (difference signal between the active bit line 4a and the reference line 4b), the bit line 4a is conversely subjected to a charge reversal to 0 volts or the operating voltage, and thus so, too, is the storage capacitor 22. The reference line is subjected to charge reversal with opposite polarity.

As a result of the change in potential of the parasitic coupling capacitances 2, the read signal of the activated bit lines 4a, 4c and 4e (FIG. 1) can be added constructively or destructively to the read signal. At the same time, the active bit line 4a, 4c, 4e always couples destructively onto the dedicated reference line 4b, 4d, 4f, which can lead to corresponding incorrect evaluations during operation. When testing DRAMs, the data topologies, in particular, are tested, in the case of which the read signal is destructively disturbed to a maximum extent.

FIG. 3 shows a schematic illustration of the invention. The sense amplifiers 3 are disposed in the left-hand part of FIG. 3, to which activated bit lines 50 (of memory cells that are not illustrated) are led and via which the individual memory cells are read and evaluated by the sense amplifier 3. An inactive bit line 51 is in each case disposed between two bit lines 50. The inactive bit lines 51 serve for the shielding of the bit lines 50 and are charged to a predetermined potential, preferably a precharge voltage Vpre, during the read operation. Owing to the shielding, the individual read signals of the activated bit lines cannot mutually influence one another, because possible fluctuations in the precharge voltage Vpre couple onto all the bit lines 50 in the same sense. Advantageously, they thus do not alter the voltage of the read signal.

In a supplementary manner, the right-hand part of FIG. 3 also uses small voltage diagrams to illustrate the profile of the voltages on the bit lines 50, while the active bit lines 51 are charged to the potential Vpre. Depending on the charge state of the memory cell, the voltage of the bit line 50 changes to a higher or a lower voltage during the read-out of the memory cell, while the voltage on the active bit lines is kept constant.

FIGS. 4a and 4b show two alternative exemplary embodiments of the invention. The two circuit configurations are of similar construction, as has been described in FIG. 3, i.e. a shielding inactive bit line 4b, 4d, 4f is disposed between each bit line 4a, 4c, 4e.

In FIG. 4a, the bit lines 4a, 4c, 4e are connected to the sense amplifiers 3 in the left-hand part of FIG. 4a, while the inactive lines 4b, 4d, 4f are connected to sense amplifiers 3 illustrated in the right-hand part of FIG. 4a. The last-mentioned sense amplifiers 3 charge the inactive bit lines 4b, 4d, 4f to the potential Vpre, which can again be discerned from the small diagrams. In contrast, the sense amplifiers 3 disposed on the left read the memory cells via the bit lines 4a, 4c, 4e.

FIG. 4b shows an alternative circuit configuration with a changed activation scheme in comparison with FIG. 4a, both solutions also being able to be used simultaneously in a layout of a memory chip. The construction of the circuit configuration essentially corresponds to that of FIG. 4a with the difference that the functions of the active bit lines and inactive bit lines are interchanged. In this exemplary embodiment, the lines 4a, 4c, 4e are charged to the potential Vpre by the sense amplifiers 3 and serve as shields. In contrast, the lines 4b, 4d, 4f serve as bit lines via which the memory cells are read. The corresponding voltage profiles are again illustrated in the diagrams in the right-hand part of FIG. 4b. In this case, too, the read signal of the bit lines 4b, 4d, 4f is not adversely influenced by the coupling capacitors 2.

FIG. 5 shows a third exemplary embodiment of the invention, in which the architecture of the memory cell array has been changed. By way of example, in an activation array I, the bit lines 4b, 4e are connected to a sense amplifier 3b. The bit lines 4b, 4e represent a bit line and a reference bit line pair. The bit line 4e has the function of a reference line and the bit line 4b has the function of a read-out line. In this case, a memory cell 1 has been connected to the assigned bit line 4b, which can be activated via the word line 5b. The same applies correspondingly to the bit line 4d in the left-hand part of FIG. 5. Furthermore, in an activation array II, the line 4a is connected to the sense amplifier 3a and the lines 4c and 4f are connected to the sense amplifier 3c. In this embodiment, the bit line 4f represents the reference line and the bit line 4c represents the read-out line. The memory cells 1 of the lines 4c and 4g, etc. can be activated via the word line 5a. Capacitances have formed between all adjacent line pairs, the capacitances being indicated in the form of an equivalent circuit diagram of the coupling capacitors 2. In this case, the lines 4a, 4e and 4f in each case serve as reference line for the sense amplifiers 3a and 3b and 3c, respectively. The illustration is intended only to reproduce the basic construction of the entire circuit configuration and is to be seen only as a detail. The mode of action on the coupling capacitors 2 is the same as has already been explained above. In FIG. 5, bit lines 4b, 4c, 4e, 4f of different sense amplifiers 3b, 3c are disposed alternately next to one another. The bit lines 4b, 4e of a sense amplifier 3b are disposed in a memory array that is disposed between two rows of sense amplifiers.

FIG. 6 shows a fourth exemplary embodiment of the invention. This exemplary embodiment shows a larger detail from the memory architecture, in which three activation arrays I, II and III are illustrated schematically. In this case, the sense amplifiers 3a . . . 3m are disposed in such a way that in each case a read-out and a reference line from an adjacent activation array is led to each sense amplifier 3a . . . 3m. By way of example, the bit and reference lines of the activation arrays I and II are led to the sense amplifiers 3b, 3d, 3f of the activation array II. Thus, e.g. the sense amplifier 3b is connected to the memory cells 1 of the lines 4b and 4m. Correspondingly, the sense amplifiers 3d are connected to the lines 4d and 4n and the sense amplifier 3f is connected to the lines 4f and 4p. Depending on the driving of the word lines, one of the bit lines connected to a sense amplifier 3b, 3d, 3f represent a reference line or a read-out line.

The assigned memory cells 1 can be addressed via corresponding word lines 5a . . . 5f. Depending on which of the word lines 5a . . . 5f has been activated, the word line acts as a bit line for the assigned read memory. During the read operation, its respective second line is not activated or is set to the predetermined potential Vpre and forms the reference line. If the word line 5a, for example, is activated, then the sense amplifier 3b reads out the content of the memory cell 1, in this case via the bit line 4b. At this point in time, the word line 5d is deactivated, so that the line 4m is valid as the reference line. The same applies correspondingly to the other sense amplifiers and the lines thereof. Of course, the coupling capacitors 2 form in the case of this circuit configuration, too, but they cannot impair the read signal.

It shall be pointed out supplementarily that the activation arrays I and III for the sense amplifiers 3a, 3c, 3e, 3m and 3h, 3i, 3k, 3l, respectively, have not been continued completely, for reasons of clarity. However, the lines portrayed by dashes show the further structural construction of the memory architecture. In FIG. 6, the two bit lines 4b, 4m of a sense amplifier 3b are disposed in two different memory arrays 60, 61 which are formed in each case on one side of the sense amplifier 3b. Bit lines of different read memories are preferably disposed alternately in each memory array 60, 61, the read memories of two adjacent bit lines being formed on different sides of the memory array.

FIG. 7 shows a fifth exemplary embodiment, in which, however, sense amplifiers 3a . . . 3g are used which are able to evaluate the potential of the bit lines 4a . . . 4g without an assigned reference line. By way of example, the bit line 4a is connected to the sense amplifier 3a, the bit line 4b is connected to the sense amplifier 3b, etc. In this way, a memory cell 1 is in each case connected to the corresponding sense amplifier if it has been activated via the assigned word line 5a, 5b, etc. The cell array architecture thus corresponds to the architectures of FIGS. 5 and 6.

In the event of activation of the activation array I, for example, by the word line 5b, the bit lines 4c, 4e, 4g are read and the bit lines 4b, 4c, 4f, which are connected to the sense amplifiers 3b, 3d, 3f of the second activation array II, are simultaneously charged to the precharge voltage Vpre. In this way, each bit line 4c, 4e, 4g via which a datum is read out is adjacent to a bit line 4b, 4d, 4f which has a shielding potential. An essential idea of the invention consists in keeping at least individual bit lines, preferably the reference lines, at a defined voltage during the read-out operation. The defined voltage preferably corresponds to the precharge voltage. The precharge voltage corresponds to the voltage with which the bit line is charged prior to the read-out of a datum. Depending on the embodiment, it is also possible to use other voltages of suitable magnitude.

However, the precharge voltage Vpre is expediently used as shielding voltage, which usually lies precisely between the positive reference potential ($V_{BLH}$) and 0 V. In other words, $$V_{PRE} = \frac{V_{BLH}}{2}$$

As a result, the inactive bit line is already precharged to the correct voltage for the next active cycle, in which the role of active and inactive bit lines may be interchanged.

I claim:

1. A memory circuit configuration, comprising:

word lines disposed in a column form;

bit lines disposed in a row form;

sense amplifiers; and a multiplicity of memory cells, each of said memory cells including a single transistor and a storage capacitor;

said memory cells being connected to and activated by said word lines, said bit lines connecting said memory cells to said sense amplifiers, upon activating a respective word line of said word lines, at least one of said bit lines being a first bit line and being associated with a respective memory cell of said memory cells, electrically connecting said respective memory cell to a respective first sense amplifier of said sense amplifiers for reading-out a datum, a second sense amplifier of said sense amplifiers during the reading-out on said first bit line putting an adjacent one of said bit lines being a second bit line adjacent to said first bit line actively at a precharge potential;

said second bit line being associated with said second sense amplifier of said sense amplifiers, said second amplifier being disposed in a different activation array at an opposite side of a field of bit lines with respect to said first sense amplifier;

one side of each of said sense amplifiers being associated with a pair of said bit lines, a bit line of a second of said sense amplifiers being disposed between a pair of bit lines of first of said sense amplifiers.

2. The memory circuit configuration according to claim 1, wherein one of said sense amplifiers puts said second bit line at a potential of a precharge state.

3. The memory circuit configuration according to claim 1, wherein said respective sense amplifier puts said first bit line actively at a precharge potential while said sense amplifiers read out said second bit line.

4. The memory circuit configuration according to claim 1, wherein said bit lines include a third bit line and a fourth bit line, said first bit line and said third bit line are connected to a first of said sense amplifiers and said second bit line and said fourth bit line are connected to a second of said sense amplifiers.

5. The memory circuit configuration according to claim 1, wherein in each case two adjacent ones of said bit lines are connected to different ones of said sense amplifiers.

6. The memory circuit configuration according to claim 5, wherein each of said sense amplifiers is connected to a bit line functioning as a reference line, said reference line connected to one of said memory cells which is presently not activated and is disposed in an adjacent activation array.

7. The memory circuit configuration according to claim 1, wherein said respective sense amplifier carries out an evaluation of a read signal without a reference bit line.

8. The memory circuit configuration according to claim 1, wherein said respective sense amplifier puts said second bit line at a potential of a precharge state.

9. The memory circuit configuration according to claim 1, wherein said respective sense amplifier puts said first bit line actively at a precharge potential while said respective sense amplifier reads out said second bit line.

10. The memory circuit configuration according to claim 1, wherein said memory cells are a dynamic random access memory cells.

11. The memory circuit configuration according to claim 1, wherein in each case two adjacent ones of said bit lines are connected to one of said sense amplifiers.

12. A method for reading a datum from a memory cell of a memory array via a first bit line, the memory array having a plurality of bit lines being disposed next to one another, which comprises the steps of:

providing the memory cell with a single transistor and a storage capacitor;

activating a word line connected to the memory cell for connecting the first bit line associated with a first sense amplifier to the memory cell;

putting at least one second bit line disposed next to the first bit line and being associated with at least a second sense amplifier different than the first sense amplifier at a defined voltage;

connecting each sense amplifier to a pair of the bit lines and placing a bit line of the second sense amplifier between the pair of bit lines of the first sense amplifier; and reading-out and evaluating a voltage impressed on the first bit line.

13. The method according to claim 12, which comprises setting the defined voltage to be a precharge voltage to which the second bit line is charged prior to the reading-out of the datum.

14. The method according to claim 12, which comprises putting the word line at a further defined voltage during the reading-out.

* * * * *